(12) United States Patent
Misheloff et al.

(10) Patent No.: US 6,751,579 B1
(45) Date of Patent: Jun. 15, 2004

(54) METHOD OF SCALING TABLE BASED CELL LIBRARY TIMING MODELS IN ORDER TO TAKE INTO ACCOUNT PROCESS, TEMPERATURE AND POWER SUPPLY

(75) Inventors: Michael N. Misheloff, Dublin, CA (US); Paul R. Findley, Cupertino, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 627 days.

(21) Appl. No.: 09/264,770

(22) Filed: Mar. 9, 1999

(51) Int. Cl.[7] .............................. G06F 17/10; G06F 7/60
(52) U.S. Cl. ........................................................ 703/2
(58) Field of Search ............................................. 703/2

(56) References Cited

U.S. PATENT DOCUMENTS

| | | | |
|---|---|---|---|
| 5,559,715 A | | 9/1996 | Misheloff |
| 5,625,803 A | * | 4/1997 | McNelly et al. ............... 703/14 |
| 5,841,672 A | * | 11/1998 | Spyrou et al. .................. 716/6 |
| 5,903,468 A | * | 5/1999 | Micheloff et al. ............. 703/16 |

FOREIGN PATENT DOCUMENTS

| WO | WO 95/26533 | * 10/1995 |
|---|---|---|

OTHER PUBLICATIONS

Printout (5 pages) from Synopsis website, Feb. 10, 2001.*
R.W. Phelps, *Advanced Library Characterization for High Performance ASIC*, Proceedings of the IEEE International Asic Conference, 1991, pp. P15–3.1 through P15–3.4.

*Design Compiler Reference Manual: Optimization and Timing Analysis*, p. A–36, v. 1998.02; Synopsis On line Documentation, formerly available on the internet at www.synopsis.com.

\* cited by examiner

*Primary Examiner*—Hugh Jones
(74) *Attorney, Agent, or Firm*—Peter Zawilski (57) ABSTRACT

A method is presented for generating a timing model for a logic cell. Output load indices ($Load_1$, $Load_2$, . . . , $Load_m$) are selected which specify output load for the first logic cell. Input ramp indices ($IR_1$, $IR_2$, . . . , $IR_n$) are selected which specify input ramp for the first logic cell. Baseline output ramp values ($OR_{bl}[j,k]$) are generated for each output load index ($Load_j$) and input ramp index ($IR_k$) pair. In order to take into account process, power and temperature variations, scaling factors are used to scale the indices. For example these scaling factors can be utilized for many different logic cells in a cell library. In one embodiment, the output load indices are scaled by a first scaling factor ($\lambda$). The input ramp indices are scaled by a second scaling factor ($\rho$). Scaled output ramp values ($OR_{scaled}[j,k]$) are generated for each scaled output load index and scaled input ramp index pair. A third scaling factor ($\gamma$) is used to generate the scaled output ramp values ($OR_{scaled}[j,k]$). Additionally, delay values can be generated as well. Specifically, baseline delay values ($Delay_{bl}[j, k]$) are generated for each output load index ($Load_j$) and input ramp index ($IR_k$) pair. Scaled delay values ($Delay_{scaled}[j, k]$) are generated for each scaled output load index and scaled input ramp index pair.

21 Claims, 4 Drawing Sheets

METHOD OF SCALING TABLE BASED CELL LIBRARY TIMING MODELS IN ORDER TO TAKE INTO ACCOUNT PROCESS, TEMPERATURE AND POWER SUPPLY

BACKGROUND

The present invention concerns design and manufacturing of integrated circuits and pertains particularly to a method of scaling table based cell library timing models for process, temperature and power supply.

When designing an integrated circuit, it is generally desirable to simulate the functioning of logic circuitry within the integrated circuit. In order to accurately access the performance of the circuitry, it is desirable that the logic simulation of logic include an accurate assessment of timing delays through the circuitry, at least in the critical paths.

In general, timing delays through circuitry are caused by propagation delays through and between logic cells which comprise the circuitry. The actual amount of propagation delay through and between logic cells is generally dependent on various capacitances within and between the logic cells, as well as the current available to charge or discharge the capacitances.

When developing a timing model, it is important, therefore, to take into account the time delay introduced by charging and discharging the input capacitance of logic cells. This time delay is directly affected by the input current available to charge or discharge the input capacitance to the logic cell. This input current, in turn, is directly affected by the fan out of the output of the logic cell providing the input current.

Timing models for logic circuits are often stored in a cell library used to design the logic circuit. The timing model is used in event driven simulation and synthesis of circuits constructed from the elements of the library. The timing model generally describes the cell delay between each input pin and output pin transition. There is often a separate timing model for each cell in the library.

For submicron circuits, an accurate cell delay model generally depends upon the ramp (or transition time) of the input pin for each cell in the library. The ramp is the time it takes for the voltage of the node to pass between two pre-specified values. Generally, the model also describes the ramp of the output pin. The output ramp model depends upon the load on the output pin. In addition, for some cells, the output ramp model also depends upon the input ramp.

In a tabular cell delay model, the information is stored in a list of output load indices ($Load_1$, $Load_2$, $Load_3$, $Load_4$, ..., $Load_m$) and in a list of input ramp indices ($IR_1$, $IR_2$, $IR_3$, $IR_4$, ..., $IR_n$), and a two-dimensional "m" by "n" array of cell delay values. For each input ramp index and each load index, there is listed an output ramp and a cell delay. This is done, for example, in a separate table for each of the output ramp and the cell delay. Depending upon the implementation, the input ramp indices and the output load indices may or may not be shared by the table for the output ramp and the table for the cell delay. For cells where the output ramp does not depend upon the input ramp, the table for the output ramp is simplified so that for each load index there is listed an output ramp.

The particular values chosen for the indices may vary depending upon the cell used. Also, for a particular cell, the particular values chosen for the indices may vary depending upon the input pin/output pin combination that a particular table represents.

For each transition of every cell in a cell library, quantitative information about the delay and output ramp is for a fixed process, power supply, and temperature, (P, V, T).

For example, in a two dimensional array of delays, each entry is listed as Delay [j,k]. The numerical value of Delay [j, k] represents the value of the delay between input and output of the transition when the load on the output node is equal to $Load_j$ and the rise or fall time of the input node voltage is equal to $IR_k$. In a two dimensional array of output ramps, each output ramp is listed as OR [j,k]. The numerical value of OR [j,k] represents the value of the output ramp of the transition when the load on the output node is equal to $Load_j$ and the rise or fall time of the input node voltage is equal to $IR_k$.

For other values of output load and/or input ramp different from the values in the list of indices, the value of delay and output ramp can be approximated by interpolation of the table values (or extrapolation, if the input ramp and/or output load are outside the range of the indices).

Typically in the industry the values of delay and output ramp are determined by running SPICE simulations for each transition of every cell in the library and to obtain the values of delay and output ramp from the output of the SPICE simulations. The SPICE simulations are run at each pair of values for input ramp and output load in the list of indices. This process is known as characterization. A complete library characterization at a fixed P, V, T may involve on the order of several hundred thousand SPICE simulations.

It is necessary to have cell library timing models at a variety of P, V, T conditions; at minimum three sets of conditions (typical, best case, and worst case) are required. It is desirable, however, to obtain accurate cell library models at a variety of P, V, T conditions without multiplying the characterization effort by the number of sets of P, V, T conditions needed.

It is therefore desirable to do a complete library characterization at a baseline set of P, V, T conditions and to accurately extrapolate these results to other P, V, T conditions.

In one prior art model, the delay and output ramp are described as explicit parametric formulas of input ramp, output load, process, power supply, and temperature. P, V, T. Variations are described by evaluating the formulas at different values of P, V, T. See, R. W. Phelps, *Advanced Library Characterization for High Performance ASIC, Proceedings of the IEEE International Asic Conference,* 1991, pp. P15-3.1 through P15-3.4. However, characterization of the model for a fixed set of P, V, T conditions required 21 SPICE simulations for each transition. Characterization of the P, V, and T variations required 630 SPICE simulations for each transition. Incorporating P, V, T variations was accomplished at a cost of a factor of 30 in characterization effort.

In another prior art model, the delay and output ramp were described as explicit parametric formulas of input ramp and output load. P, V, T variations are described by 13 independent scaling factors. Each of the parameters of the model is multiplied by a scaling factor which depends upon P, V, and T. The scaling factors are the same for all cells and transitions. See U.S. Pat. No. 5,559,715 issued to Michael N. Misheloff for Timing Model and Characterization System for Logic Simulation of Integrated Circuits Which Takes into Account Process, Temperature and Power Supply Variations. While this method was effective, it did not become an industry standard and there is currently no software support for the model.

In another prior art model, P, V, T variations are incorporated using four independent scaling factors. All values of Delay [j, k] for rising output are multiplied by a scaling factor. All values of Delay [j, k] for falling output are multiplied by a second scaling factor. All values of OR [j, k] for rising output are multiplied by a third scaling factor. All values of OR [j, k] for falling output are multiplied by a fourth scaling factor. Each of the scaling factors depends upon P, V, and T. The scaling factors do not depend upon the value of the input ramp and output load. See the *Synopsis Design Compiler User Manual* available on the internet at (www.Synopsys.com) and from Synopsis, Inc. having a business address of 700 E. Middlefield Road, Mountain View, Calif. 94043-4033. However, this approach does not give sufficiently accurate results for many applications.

SUMMARY OF THE INVENTION

In accordance with a preferred embodiment of the present invention, a method is presented for generating a timing model for a logic cell. Output load indices ($Load_1$, $Load_2$, ..., $Load_m$) are selected which specify output load for the first logic cell. Input ramp indices ($IR_1$, $IR_2$, ..., $IR_n$) are selected which specify input ramp for the first logic cell. Baseline output ramp values ($OR_{bl}$ [j,k]) are generated for each output load index ($Load_j$) and input ramp index ($IR_k$) pair. The numerical value of $OR_{bl}$ [j,k] represents the value of the delay of the transition at the baseline P, V, T conditions when the load on the output node is equal to $Load_j$ and the rise or fall time of the input node voltage is equal to $IR_k$. In order to take into account process, power and temperature variations, scaling factors are used to scale the indices. For example these scaling factors can be utilized for many different logic cells in a cell library.

In one preferred embodiment, the output load indices are scaled by a first scaling factor ($\lambda$). The input ramp indices are scaled by a second scaling factor ($\rho$). Scaled output ramp values ($OR_{scaled}$ [j,k]) are generated for each scaled output load index and scaled input ramp index pair. For example, a third scaling factor ($\gamma$) is used to generate the scaled output ramp values ($OR_{scaled}$ [j,k]), using the following equation:

$$OR_{scaled}[j, k] = OR_{bl}[j, k] + (\gamma-1)^*OR_{bl}[0, 1].$$

The numerical value of $OR_{scaled}$ [j, k] represents the value of the output ramp of the transition at the new P, V, T conditions when the load on the output node is equal to $\lambda^*Load_j$ and the rise or fall time of the input node is equal to $\rho^*IR_k$.

For the equation above, baseline output ramp value at zero load and minimum input ramp ($OR_{bl}$ [0,1]) is approximated using the following equation:

$$OR_{bl}[0, 1] = OR_{bl}[1, 1] - (Load_1/(Load_m - Load_1))^*\{OR_{bl}[m, 1] - OR_{bl}[1, 1]\}.$$

Alternatively, the scaled output ramp as a function of output load and input ramp $OR_{scaled}$(Output Load, Input ramp) can be calculated in accordance with the following equation:

$$OR_{scaled}(\text{Output Load, Input ramp}) = (\gamma-1)^*OR_{bl}[0, IR_1] + OR_{bl}(\text{Output Load}/\lambda, \text{Input Ramp}/\rho).$$

In the preferred embodiment, the value of the first scaling factor varies dependent upon process, power and temperature variances. The value of the second scaling factor varies dependent upon process, power and temperature variance. The value of the third scaling factor also varies dependent upon process, power and temperature variance. Further, the value of the first scaling factor additionally varies based on whether voltage at an output node of the logic cell is rising or falling. The value of the second scaling factor also varies based on whether voltage at the output node of the logic cell is rising or falling. The value of the third scaling factor also varies based on whether voltage at the output node of the logic cell is rising or falling.

Similarly, in accordance with a preferred embodiment of the present invention, delay values can be generated as well. Specifically, baseline delay values ($Delay_{bl}$ [j, k]) are generated for each output load index ($Load_j$) and input ramp index ($IR_k$) pair. The numerical value of $Delay_{bl}$ [j, k] represents the value of the delay of the transition at the baseline P, V, T conditions when the load on the output node is equal to $Load_j$ and the rise or fall time of the input node voltage is equal to $IR_k$.

Scaled delay values ($Delay_{scaled}$ [j, k]) are generated for each scaled output load index and scaled input ramp index pair. The numerical value of $Delay_{scaled}$ [j, k] represents the value of the delay of the transition at the new P, V, T conditions when the load on the output node is equal to $\lambda^*Load_j$ and the rise or fall time of the input node voltage is equal to $\rho^*IR_k$.

For example, in order to generate the scaled delay values ($Delay_{scaled}$[j, k]), new values ($Dt0_{bl}$[j, k]) are generated for each output load index ($Load_j$) and input ramp index ($IR_k$) pair based on the baseline delay values ($Delay_{bl}$ [j, k]), the baseline output ramp values ($OR_{bl}$ [j,k]), and a factor ($\phi$) which takes into account non-linearity of voltage waveforms within the logic cell. This may be done in accordance with the following equation:

$$Dt0_{bl}[j, k] = Delay_{bl}[j, k] + IR_k/2 - \phi^*OR_{bl}[j, k]/2.$$

A third scaling factor ($\alpha$) is used to generate scaled new values ($Dt0_{scaled}$ [j, k]), for example, using the following equation:

$$Dt0_{scaled}[j, k] = Dt0_{bl}[j, k] + (\alpha-1)^*Dt0_{bl}[0, 0].$$

The scaled delay values ($Delay_{scaled}$[j, k]) for each scaled output load index and scaled input ramp index pair are then generated using the following equation:

$$Delay_{scaled}[j, k] = Dt0_{scaled}[j, k] - \rho^*IR_k/2 + \phi^*OR_{scaled}[j, k]/2.$$

The numerical value of $Delay_{scaled}$ [j, k] represents the value of the delay of the transition at the new P, V, T conditions when the load on the output node is equal to $\lambda^*Load_j$ and the rise or fall time of the input node voltage is equal to $\rho^*IR_k$.

In a preferred embodiment of the present invention, the baseline new value at zero load and zero input ramp ($Dt0_{bl}$ [0, 0]) is approximated using the following equation:

$$Dt0_{bl}[0, 0] = Dt0_{bl}[1, 1] - (Load_1/(Load_m - Load_1))^*\{Dt0_{bl}[m, 1] - Dt0_{bl}[1, 1]\} - (IR_1/(IR_n - IR_1))^*\{Dt0_{bl}[m, n] - Dt0_{bl}[m, 1]\}.$$

$Dt0_{bl}$ [0, 0] must be obtained before $Dt0_{scaled}$ [j, k] is calculated.

In an alternative embodiment, the scaled delay values ($Delay_{scaled}$ (Output Load, Input ramp) are generated for each scaled output load index and scaled input ramp index pair using the following equation:

$$Delay_{scaled}(\text{Output Load, Input ramp}) = (\phi/2)^*(\gamma-1)^*OR_{bl}[0, IR_1] + (\alpha-1)^*Dt0_{bl}[0, 0] + ((1/\rho-1)/2)^*\text{Input Ramp} + Delay_{bl}(\text{Output Load}/\lambda, \text{Input Ramp}/\rho).$$

The present invention provides an accurate and efficient way to scale table based cell library timing models in order to take into account process, temperature and power supply variations.

DESCRIPTION OF THE PREFERRED EMBODIMENT

Figure 1:
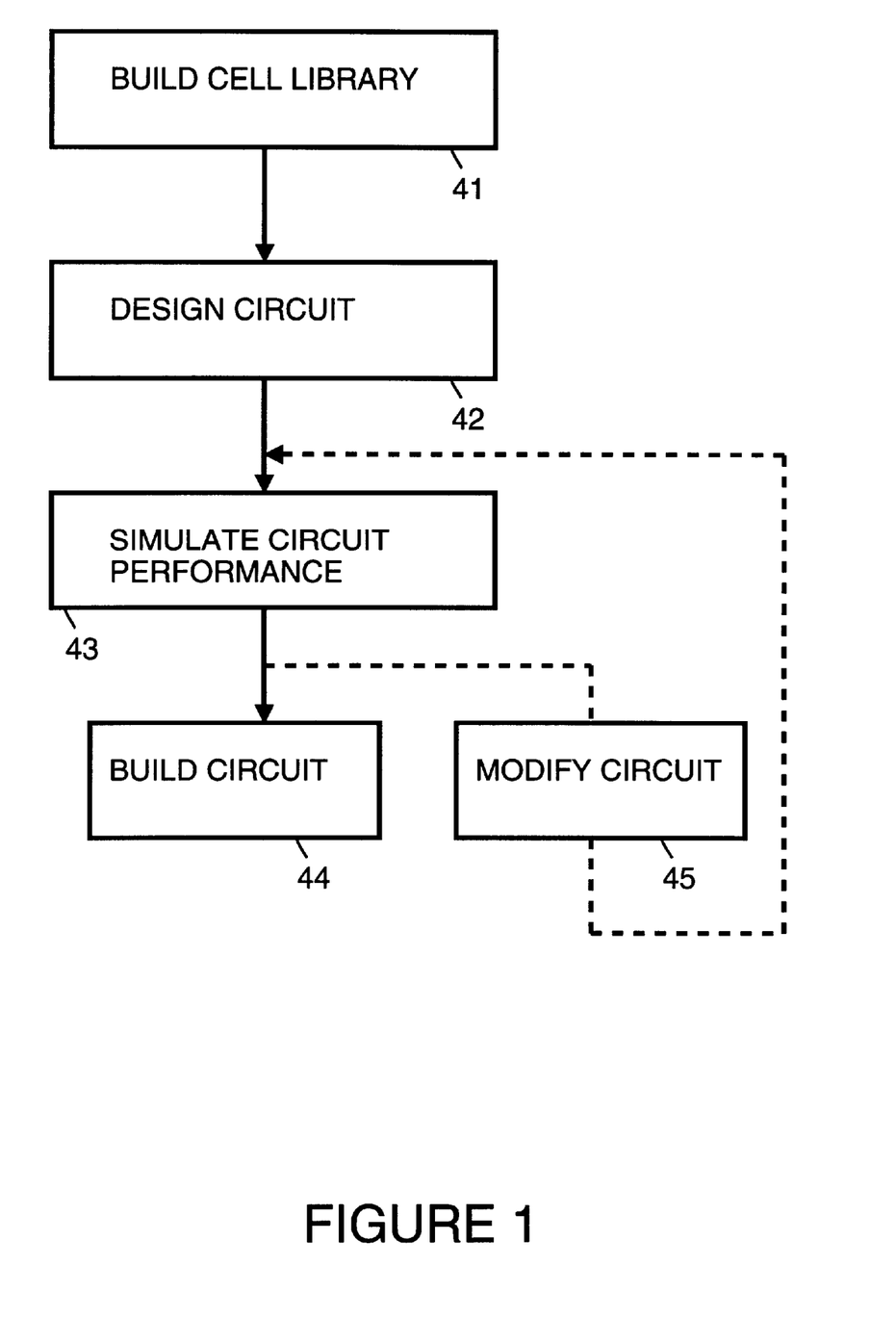
FIG. 1 sets out a simplified flowchart for designing and building an integrated circuit.

FIG. 1 sets out a simplified flowchart for designing and building an integrated circuit. In a step 41, a logic cell library is built. In a step 42, logic cells from the logic cell library are used to design the circuit. In a step 43, the circuit performance is simulated. In order to simulate performance of the circuit, performance information about each logic cell is obtained from the logic cell library. In order to improve performance, it may be necessary, in a step 45, to modify the circuit. When the performance is acceptable, in a step 44, the circuit is built.

Figure 2:
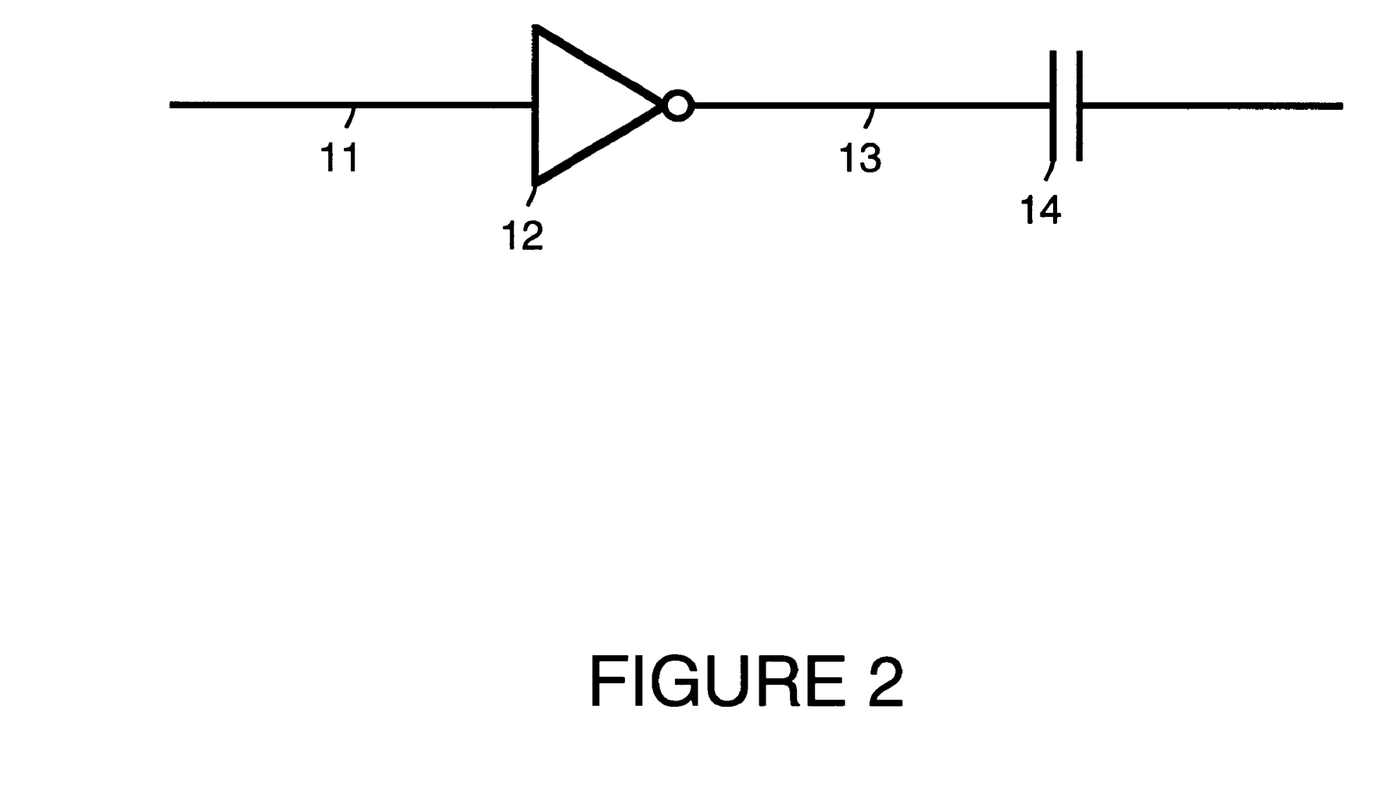
FIG. 2 shows a logic NOT gate for which a table within a cell library gives information.
Figure 3:
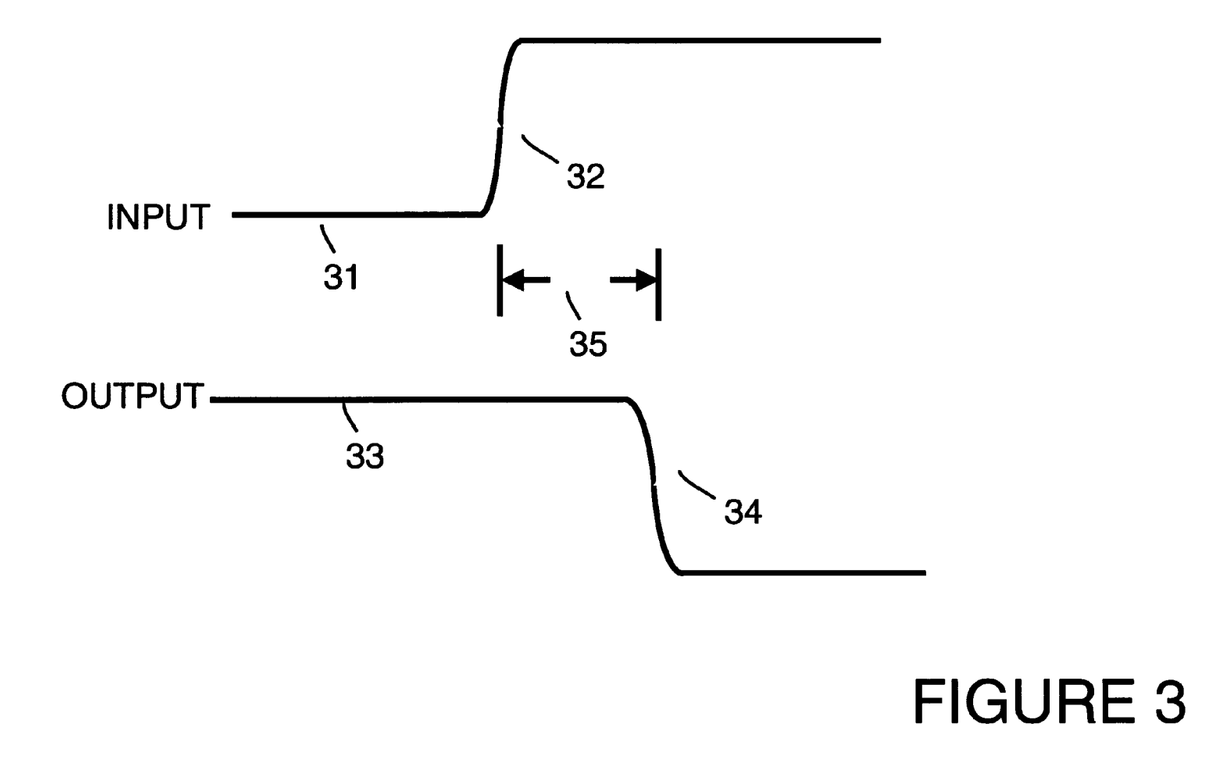
FIG. 3 shows an example of an input ramp and a resulting output ramp for the logic NOT gate shown in FIG. 2.
Figure 4:
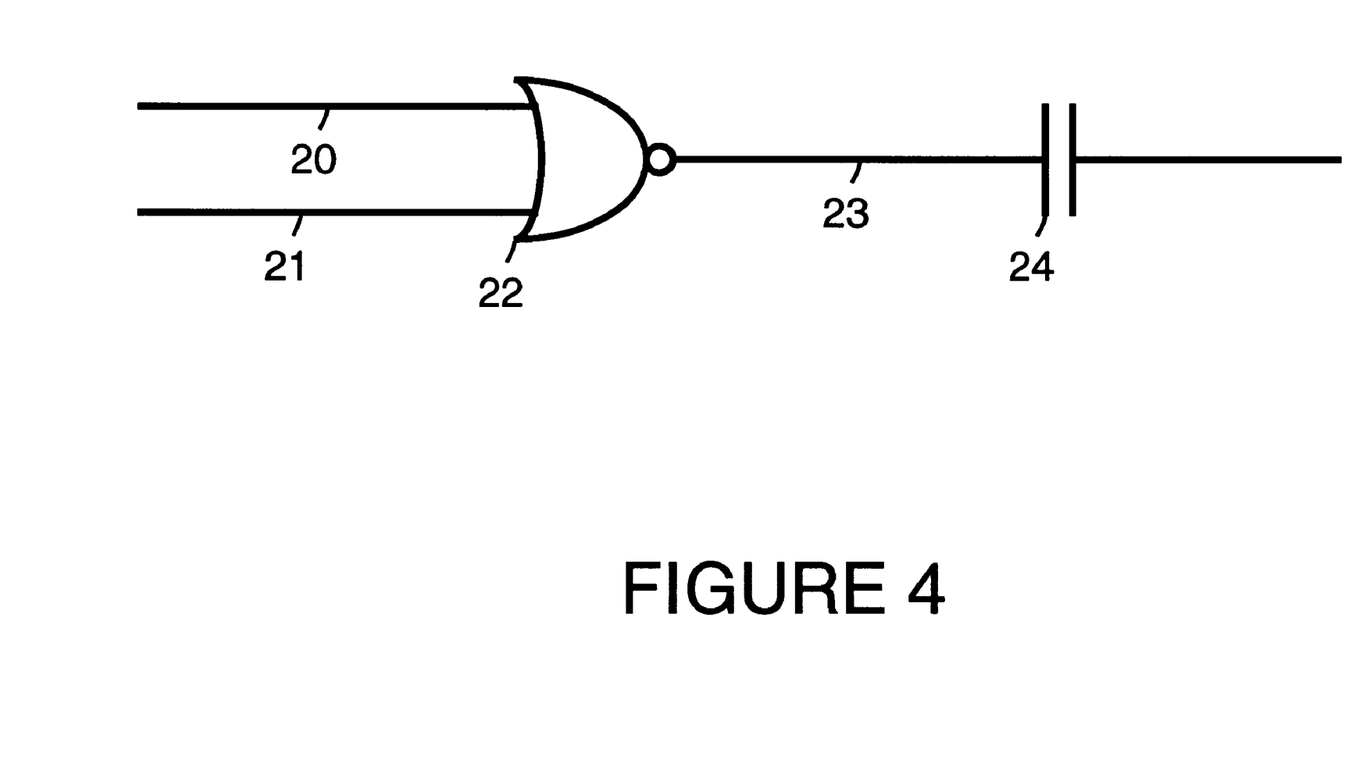
FIG. 4 shows a logic NOR gate for which a table within a cell library gives information.

The logic cell library stores information about logic cell performance. For example, for each logic cell, information about the output ramp and the logic cell delay is stored in a logic cell library. FIGS. 2, 3 and 4 illustrate what is meant by output ramp and logic cell delay.

FIG. 2 shows a logic NOT gate 12. A signal on an input 11 is inverted by logic NOT gate 12 to produce an inverted signal on an output 13. A capacitor 14 represents the capacitive load driven by logic NOT gate 12. The capacitive load driven by logic NOT gate 12 generally includes both the input capacitance of logic gates which utilize the inverted signal on output 13, as well as the capacitance of the wiring which connect these logic gates to logic NOT gate 12.

FIG. 3 shows an example of an input transition 32 and a resulting output transition 34 for logic NOT gate 12. An input signal 32 makes a transition from low (Vss) to high (Vdd). The input ramp is essentially the time it takes for the transition to occur. That is, when input signal 32 makes a transition from low (Vss) to high (Vdd), the input ramp is the time it takes for the transition to occur.

Output signal 33 makes a transition from high (Vdd) to low (Vss). The output ramp is essentially the time it takes for the transition to occur. That is, when output signal 34 makes a transition from high (Vdd) to low (Vss), the output ramp is the time it takes for the transition to occur.

A logic cell delay 35 is the delay in the occurrence between transition 32 of input signal 31 and corresponding transition 34 on output signal 33. This may be calculated in a number of ways. For example, logic cell delay 35 is the time difference between when the voltage on input signal 31 reaches ½*(Vdd−Vss) and the time when the voltage on output signal 33 reaches ½*(Vdd−Vss).

For logic NOT gate 12 shown in FIG. 2, there is only one input and one output. However, other logic gates may have plural inputs or outputs. For example, a logic NOR gate 22 shown in FIG. 4 has an input 20 and an input 21. Both a signal on input 20 and a signal on input 21 are used by logic NOR gate 22 to produce an output signal on an output 23. A capacitor 24 represents the capacitive load driven by logic NOR gate 22. The capacitive load driven by logic NOR gate 22 generally includes both the input capacitance of logic gates which utilize the output signal on output 23, as well as the capacitance of the wiring which connect these logic gates to logic NOR gate 22.

When placing performance information in a logic cell library, one methodology is to place this information in tables. There may be more than one table stored for each logic cell. A logic cell, for example, implements a logic gate such as a logic NOT gate 12 (shown in FIG. 2) or logic NOR gate 22 (shown in FIG. 4). For example, if a logic cell has more than one input and one output, a different table (or set of tables) is stored for each input/output pair. Also, generally there are separate tables for the output ramp and the logic cell delay. Depending upon the implementation, the input ramp indices and the output load indices may or may not be shared by the table for the output ramp and the table for the cell delay.

In such a tabular logic cell delay model, the information is stored in a list of output load indices ($Load_1$, $Load_2$, $Load_3$, $Load_4$, ..., $Load_m$), a list of input ramp indices ($IR_1$, $IR_2$, $IR_3$, $IR_4$, ..., $IR_n$) and an "m" by "n" array of logic cell delay values. For each input ramp index and each load index, there is listed an output ramp and/or a logic cell delay. When the timing model is used during circuit performance simulation (e.g., in step 43 shown in FIG. 1), the value of the logic cell delay and output ramp for a logic cell instance are obtained from interpolation (or extrapolation, if the input ramp and/or output load are outside the range of the indices) of the table values.

The following discussion is a detailed description of the scaling algorithms used for delays and output ramps that varying process, temperature, and power supply.

It is assumed that delays (defined as the time interval between when the input and output pass 50% of Vdd) and output ramps for a transition of a cell have been characterized at baseline SPICE model, temperature and power supply voltage at a list of output load indices. Nomenclature for the base line output load indices is set out in Equation 1 below:

$$\text{Baseline output load list} = [Load_1, Load_2, \ldots, Load_m] \quad \text{Equation 1}$$

Nomenclature for the input ramp indices is set out in Equation 2 below:

$$\text{Baseline input ramp list} = [IR_1, IR_2, \ldots, IR_n] \quad \text{Equation 2}$$

The numerical value of $\text{Delay}_{bl}[j, k]$ represents the value of the baseline delay between input and output of the transition when the load on the output ramp is equal to $Load_j$ and the rise or fall time of the input ramp is equal to $IR_k$. The numerical value of $OR_{bl}[j,k]$ represents the value of the base line input ramp of the transition when the load on the output ramp is equal to $Load_j$ and the rise or fall time of the input ramp is equal to $IR_k$.

A new table, called $Dt0_{bl}[j, k]$ is constructed from the delay and output ramp tables, the list of input ramp indices and a quantity called $\phi$ which will be described below. $Dt0_{bl}[j, k]$ is essentially the baseline condition time interval between when the input and output begin to transition and is defined in Equation 3 below:

$$Dt0_{bl}[j, k] = \text{Delay}_{bl}[j, k] + IR_k/2 - \phi^* OR_{bl}[j, k]/2 \quad \text{Equation 3}$$

For further information see U.S. Pat. No. 5,559,715 issued to Michael N. Misheloff for Timing Model and Characterization System for Logic Simulation of Integrated Circuits Which Takes into Account Process, Temperature and Power Supply Variations. See also U.S. Pat. No. 5,548,526 also issued to Michael N. Misheloff.

In the preferred embodiment, two values of $\phi$ are provided for each library, one for the output voltage rising from Vss to Vdd, the other for the output voltage falling from Vdd to Vss. The actual values of $\phi$ depend upon the choice of the trip points used to determine the output ramps.

In general, the minimum output load, $Load_1$, and the minimum input ramp, $IR_1$, of the table will not be equal to zero. An approximation to $Dt0_{bl}$ at zero output load and zero input ramp is obtained by extrapolation as set out in Equation 4 below:

$$Dt0_{bl}[0, 0]=Dt0_{bl}[1, 1]-(Load_1/(Load_m-Load_1))*\{Dt0_{bl}[m, 1]-Dt0_{bl}[1, 1]\}-(IR_1/(IR_n-IR_1))*\{Dt0_{bl}[m, n]-Dt0_{bl}[m, 1]\}$$

Equation 4

Similarly, an approximation to $OR_{bl}$ at zero load and minimum input ramp is given by Equation 5 below:

$$OR_{bl}[0, 1]=OR_{bl}[1, 1]-(Load_1/(Load_m-Load_1))*\{OR_{bl}[m, 1]-OR_{bl}[1, 1]\}$$

Equation 5

Scaled delay and output ramp tables for the transition, i.e. delay and output ramp tables for a different SPICE model, power supply, and/or temperature, are expressed based on the baseline Dt0 and output ramp tables and scaling factors, as described below.

The output load indices are scaled by a scaling factor $\lambda$ as set out in Equation 6 below:

$$\text{Scaled output load list}=[\lambda*Load_1, \lambda*Load_2, \ldots, \lambda*Load_m]$$

Equation 6

The input ramp indices are scaled by a scaling factor $\rho$ as set out in Equation 7 below:

$$\text{Scaled input ramp list}=[\rho*IR_1, \rho*IR_2, \ldots, \rho*IR_n]$$

Equation 7

A scaled output ramp table is obtained from the baseline output ramp table and a scaling factor $\gamma$ as set out in Equation 8 below:

$$OR_{scaled}[j, k]=OR_{bl}[j, k]+(\gamma-1)*OR_{bl}[0, 1]$$

Equation 8

A scaled Dt0 table is obtained from the baseline Dt0 table and a scaling factor $\alpha$ as set out in Equation 9 below:

$$Dt0_{scaled}[j, k]=Dt0_{bl}[j, k]+(\alpha-1)*Dt0_{bl}[0, 0]$$

Equation 9

A scaled delay table is obtained as set out in Equation 10 below:

$$Delay_{scaled}[j, k]=Dt0_{scaled}[j, k]-\rho*IR_k/2+\phi*OR_{scaled}[j, k]/2$$

Equation 10

In an alternative preferred embodiment of the present invention, after constructing the Dt0 table (as in Equation 3) and the quantities $Dt0_{bl}[0, 0]$ (as in Equation 4) and $OR_{bl}[0, 1]$ (as in Equation 5), the scaled output ramp is expressed as a function of the output load and input ramp as set out in Equation 11 below:

$$OR_{scaled}(\text{Output Load, Input ramp})=(\gamma-1)*OR_{bl}[0, 1]+OR_{bl}(\text{Output Load}/\lambda, \text{Input Ramp}/\rho)$$

Equation 11

The scaled delay can be expressed as a function of the output load and input ramp as set out in Equation 12 below:

$$Delay_{scaled}(\text{Output Load, Input ramp})=(\phi/2)*(\gamma-1)*OR_{bl}[0, 1]+(\alpha-1)*Dt0_{bl}[0, 0]+((1/\rho-1)/2)*\text{Input Ramp}+Delay_{bl}(\text{Output Load}/\lambda, \text{Input Ramp}/\rho)$$

Equation 12

In Equation 11 and Equation 12, the quantities $OR_{bl}$ (Output Load/$\lambda$, Input Ramp/$\rho$) and $Delay_{bl}$(Output Load/$\lambda$, Input Ramp/$\rho$) are obtained from interpolation (or extrapolation) of the baseline output ramp and delay tables.

These expressions can be incorporated directly into the delay calculator or can be used to construct scaled output ramp and delay tables at desired input ramp and output load indices.

In the above equations four scaling factors ($\lambda$, $\rho$, $\gamma$, and $\alpha$) have been introduced for each transition. In fact, the value for the scaling factors ($\lambda$, $\rho$ and $\gamma$), varies depending upon whether the output node voltage is rising or falling. In essence then, the seven scaling factors described below are utilized for a cell library.

Thus there is one value for $\alpha$ which is used for all transitions. There are two values for $\lambda$: $\lambda+$ and $\lambda-$. For a particular transition, $\lambda+$ will be used if the output node voltage rises. $\lambda-$ will be used if the output node voltage falls. There are two values for $\gamma$. $\gamma+$ and $\gamma-$. For a particular transition, $\gamma+$ will be used if the output node voltage rises. $\gamma-$ will be used if the output node voltage falls. There are two values for $\rho$: $\rho+$ and $\rho-$. For a particular transition, $\rho+$ will be used if the input node voltage rises. $\rho-$ will be used if the input node voltage falls.

Separate process, power supply, and voltage dependence are incorporated by writing each scaling factor as a product of process, temperature, and power dependent factors. This is illustrated by Equation 13 below:

$$\alpha=\alpha_{process}*\alpha_{temp}*\alpha_{Vdd}$$

Equation 13

For the process factor (e.g., $\alpha_{process}$), discrete values will be given. For example, a separate discrete value for a typical process, a fast process, and slow process will be specified. Even though the baseline process will be either a typical process, a fast process, or a slow process, provision should be made for a baseline process factor different from 1. This will, for example, enable the incorporation of a SPICE model change by scaling rather than recharacterization.

To calculate the temperature factor (e.g., $\alpha_{temp}$), the Vdd factor (e.g., ($\alpha_{Vdd}$) dependence can be incorporated by quadratic equation. For example, Equation 14 below shows an example of a quadratic equation used for temperature:

$$(\alpha_{Temp}=1+\alpha_{temp1}*(\text{temp}-\text{temp}_{bl})+\alpha_{temp2}*(\text{temp}-\text{temp}_{bl})^2$$

Equation 14

Equation 15 below shows an example of a quadratic equation used for Vdd:

$$(\alpha_{Vdd}=1+\alpha_{Vdd1}*((Vdd/Vdd_{bl})-1)+\alpha_{Vdd2}*((Vdd/Vdd_{bl})-1)^2$$

Equation 15

In the preferred embodiment, each logic cell within the library is characterized at baseline conditions to obtain parameters for each logic cell which define propagation delay through each logic cell at the baseline conditions. A subset of the logic cells are characterized at conditions varying from the baseline conditions to obtain scaling parameters. The scaling parameters modify values of the parameters for all logic cells within the library in order to approximate changes in propagation delay through each logic cell resulting from different manufacturing conditions or operation at temperature and power supply conditions other than baseline. In the preferred embodiment, the conditions varying from the baseline conditions includes a change in at least one of operating temperature, power supply voltage and process conditions. For more information on generating scaling parameters, see U.S. Pat. No. 5,559,714 issued to Michael N. Misheloff for Timing Model and Characterization System for Logic Simulation of Integrated Circuits Which Takes into Account Process, Temperature and Power Supply Variations.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a logic cell, the method comprising the following steps:
   (a) generating a timing model for the logic cell, including the following substeps:
      (a.1) selecting output load indices ($Load_1$, $Load_2$, ..., $Load_m$) which specify output load for the first logic cell,
      (a.2) selecting input ramp indices ($IR_1$, $IR_2$, ..., $IR_n$) which specify input ramp for the first logic cell,
      (a.3) generating baseline output ramp values ($OR_{bl}$ [j,k]) for each output load index ($Load_j$) and input ramp index ($IR_k$) pair,
      (a.4) scaling the output load indices by a first scaling factor ($\lambda$),
      (a.5) scaling the input ramp indices by a second scaling factor ($\rho$), and
      (a.6) generating scaled output ramp values ($OR_{scaled}$ [j,k]) for each scaled output load index and scaled input ramp index pair, wherein a numerical value of $OR_{scaled}$ [j, k] represents a value of output ramp at new Process, Power supply, Temperature conditions when the output load for the first logic cell is equal to $\lambda^*Load_j$ and the input ramp for the first logic cell is equal to $\rho^*IR_k$; and,
   (b) building the logic cell based on the timing model generated in step (a).

2. A method as in claim 1 wherein substep (a.6) includes using a third scaling factor ($\gamma$) to generate the scaled output ramp values ($OR_{scaled}$ [j,k]), using the following equation:

$$OR_{scaled}[j, k] = OR_{bl}[j, k] + (\gamma - 1)^* OR_{bl}[0, 1].$$

3. A method as in claim 2 wherein baseline output ramp value at zero load and minimum input ramp ($OR_{bl}$ [0,1]) is approximated using the following equation:

$$OR_{bl}[0, 1] = OR_{bl}[1, 1] - (Load_1/(Load_m - Load_1))^* \{OR_{bl}[m, 1] - OR_{bl}[1, 1]\}.$$

4. A method as in claim 1 wherein substep (a.6) includes using a third scaling factor ($\gamma$) to generate the scaled output ramp as a function of output load and input ramp $OR_{scaled}$ (Output Load, Input ramp) in accordance with the following equation:

$$OR_{scaled}(\text{Output Load, Input ramp}) = (\gamma - 1)^* OR_{bl}[0,1] + OR_{bl}(\text{Output Load}/\lambda, \text{Input Ramp}/\rho).$$

5. A method as in claim 4 wherein baseline output ramp value at zero load and minimum input ramp ($OR_{bl}$ [0,1]) is approximated using the following equation:

$$OR_{bl}[0,1] = OR_{bl}[1, 1] - (Load_1/(Load_m - Load_1))^* \{OR_{bl}[m, 1] - OR_{bl}[1,1]\}.$$

6. A method as in claim 1 wherein substep (a.6), includes using a third scaling factor ($\gamma$) to generate the scaled output ramp values ($OR_{scaled}$ [j,k]).

7. A method as in claim 6 wherein a value of the first scaling factor varies dependent upon process, power and temperature variances, wherein a value of the second scaling factor also varies dependent upon process, power and temperature variance, and wherein a value of the third scaling factor also varies dependent upon process, power and temperature variance.

8. A method as in claim 7 wherein the value of the first scaling factor additionally varies based on whether voltage at an output node of the logic cell is rising or falling, wherein the value of the second scaling factor also varies based on whether voltage at the output node of the logic cell is rising or falling, and wherein the value of the third scaling factor also varies based on whether voltage at the output node of the logic cell is rising or falling.

9. A method as in claim 1 wherein step (a) additionally comprises the following substeps:
   (a.7) generating baseline delay values ($Delay_{bl}$ [j, k]) for each output load index ($Load_j$) and input ramp index ($IR_k$) pair; and,
   (a.8) generating scaled delay values ($Delay_{scaled}$ [j, k]) for each scaled output load index and scaled input ramp index pair.

10. A method as in claim 9 wherein:
    substep (a.8) includes the following substeps:
        generating new values ($Dt0_{bl}$[j, k]) for each output load index ($Load_j$) and input ramp index ($IR_k$) pair based on the baseline delay values ($Delay_{bl}$ [j, k]), the baseline output ramp values ($OR_{bl}$ [j,k]), and a factor ($\phi$) which takes into account non-linearity of voltage waveforms within the logic cell, in accordance with the following equation:

$$Dt0_{bl}[j, k] = Delay_{bl}[j, k] + IR_k/2 - \phi^* OR_{bl}[j, k]/2;$$

using a third scaling factor ($\alpha$) to generate scaled new values ($Dt0_{scaled}$ [j, k]), using the following equation:

$$Dt0_{scaled}[j, k] = Dt0_{bl}[j, k] + (\alpha - 1)^* Dt0_{bl}[0, 0];$$

and,
generating the scaled delay values ($Delay_{scaled}$ [j, k]) for each scaled output load index and scaled input ramp index pair using the following equation:

$$Delay_{scaled}[j, k] = Dt0_{scaled}[j, k] - \rho^* IR_k/2 + \phi^* OR_{scaled}[j, k]/2.$$

11. A method as in claim 10 wherein baseline new value at zero load and zero input ramp ($Dt0_{bl}$ [0, 0]) is approximated using the following equation:

$$Dt0_{bl}[0,0] = Dt0_{bl}[1, 1] - (Load_1/(Load_m - Load_1))^* \{Dt0_{bl}[m, 1] - Dt0_{bl}[1, 1]\} - (IR_1/(IR_n - IR_1))^* \{Dt0_{bl}[m, n] - Dt0_{bl}[m, 1]\}.$$

12. A method as in claim 9 wherein substep (a.8) includes the following substeps:.
    generating new values ($Dt0_{bl}$ [j, k]) for each output load index ($Load_j$) and input ramp index ($IR_k$) pair based on the baseline delay values ($Delay_{bl}$ [j, k]), the baseline output ramp values ($OR_{bl}$ [j,k]), and a factor ($\phi$) which takes into account non-linearity of voltage waveforms within the logic cell, in accordance with the following equation:

$$Dt0_{bl}[j, k] = Delay_{bl}[j, k] + IR_k/2 - \phi^* OR_{bl}[j, k]/2;$$

using a third scaling factor ($\alpha$) to generate scaled new values ($Dt0_{scaled}$ [j, k]), using the following equation:

$$Dt0_{scaled}[j, k] = Dt0_{bl}[j, k] + (\alpha - 1)^* Dt0_{bl}[0, 0];$$

and,
generating the scaled delay values ($Delay_{scaled}$ (Output Load, Input ramp) for each scaled output load index and scaled input ramp index pair using the following equation:

Delay$_{scaled}$(Output Load, Input ramp)=$(\phi/2)*(\gamma-1)*OR_{bl}[0, 1]+(\alpha-1)*Dt0_{bl}[0, 0]+((1/\rho-1)/2)*$Input Ramp+Delay$_{bl}$(Output Load/$\lambda$, Input Ramp/$\rho$).

13. A method as in claim 12 wherein baseline output ramp value at zero load and minimum input ramp (OR$_{bl}$ [0,1]) is approximated using the following equation:

OR$_{bl}$[0, 1]=OR$_{bl}$[1, 1]-(Load$_1$/(Load$_m$-Load$_1$))*{OR$_{bl}$[m, 1]-OR$_{bl}$[1, 1]}, and wherein baseline new value at zero load and zero input ramp (Dt0$_{bl}$ [0, 0]) is approximated using the following equation:

Dt0$_{bl}$[0, 0]=Dt0$_{bl}$[1, 1]-(Load$_1$/(Load$_m$-Load$_1$))*{Dt0$_{bl}$[m, 1]-Dt0$_{bl}$[1, 1]}-(IR$_1$/(IR$_n$-IR$_1$))*{Dt0$_{bl}$[m, n]-Dt0$_{bl}$[m, 1]}.

14. A method for producing a logic cell, the method comprising the following steps:
(a) generating a timing model for the logic cell, including the following substeps:
   (a.1) selecting output load indices (Load$_1$, Load$_2$, . . . ,Load$_m$) which specify output load for the first logic cell,
   (a.2) selecting input ramp indices (IR$_1$, IR$_2$, . . . ,IR$_n$) which specify input ramp for the first logic cell,
   (a.3) generating baseline delay values (Delay$_{bl}$ [j, k]) for each output load index (Load$_j$) and input ramp index (IR$_k$) pair,
   (a.4) scaling the output load indices by a first scaling factor ($\lambda$),
   (a.5) scaling the input ramp indices by a second scaling factor ($\rho$), and
   (a.6) generating scaled delay values (Delay$_{scaled}$ [j, k]) for each scaled output load index and scaled input ramp index pair, wherein a numerical value of Delay$_{scaled}$ [j, k] represents a value of transition delay at new Process, Power supply, Temperature conditions when the output load for the first logic cell is equal to $\lambda*$Load$_j$ and the input ramp for the first logic cell is equal to $\rho*$IR$_k$; and,
(b) building the logic cell based on the timing model generated in step (a).

15. A method as in claim 14 wherein substep (a.6) includes the following substeps:
generating baseline output ramp values (OR$_{bl}$ [j,k]) for each output load index (Load$_j$) and input ramp index (IR$_k$) pair;
generating new values (Dt0$_{bl}$ [j, k]) for each output load index (Load$_j$) and input ramp index (IR$_k$) pair based on the baseline delay values (Delay$_{bl}$ [j, k]), the baseline output ramp values (OR$_{bl}$ [j,k]), and a factor ($\phi$) which takes into account non-linearity of voltage waveforms within the logic cell, in accordance with the following equation:

Dt0$_{bl[j, k]}$=Delay$_{bl}$[j, k]+IR$_k$/2-$\phi*$OR$_{bl}$[j, k]/2;

using a third scaling factor ($\alpha$) to generate scaled new values (Dt0$_{scaled}$ [,j k]), using the following equation:

Dt0$_{scaled}$[j, k]=Dt0$_{bl}$[j, k]+($\alpha$-1)*Dt0$_{bl}$[0, 0];

generating scaled output ramp values (OR$_{scaled}$ [j,k]) for each scaled output load index and scaled input ramp index pair; and, generating the scaled delay values (Delay$_{scaled}$ [j, k]) for each scaled output load index and scaled input ramp index pair using the following equation:

Delay$_{scaled}$[j, k]=Dt0$_{scaled}$[j, k]-$\rho*$IR$_k$/2+$\phi*$OR$_{scaled}$[j, k]/2.

16. A method as in claim 15 wherein baseline new value at zero load and zero input ramp (Dt0$_{bl}$ [0, 0]) is approximated using the following equation:

Dt0$_{bl}$[0, 0]=Dt0$_{bl}$[1, 1]-(Load$_1$/(Load$_m$-Load$_1$))*{Dt0$_{bl}$[m, 1]-Dt0$_{bl}$[1, 1]}-(IR$_1$/(IR$_n$-IR$_1$))*{Dt0$_{bl}$[m, n]-Dt0$_{bl}$[m, 1]}.

17. A method as in claim 14 wherein substep (a.6) includes the following substeps:
generating baseline output ramp values (OR$_{bl}$ [j,k]) for each output load index (Load$_j$) and input ramp index (IR$_k$) pair;
generating new values (Dt0$_{bl}$ [j, k]) for each output load index (Load$_j$) and input ramp index (IR$_k$) pair based on the baseline delay values (Delay$_{bl}$ [j, k]), the baseline output ramp values (OR$_{bl}$ [j,k]), and a factor ($\phi$) which takes into account non-linearity of voltage waveforms within the logic cell, in accordance with the following equation:

Dt0$_{bl}$[j, k]=Delay$_{bl}$[j, k]+IR$_k$/2-$\phi*$OR$_{bl}$[j, k]/2;

using a third scaling factor ($\alpha$) to generate scaled new values (Dt0$_{scaled}$ [j, k]), using the following equation:

Dt0$_{scaled}$[j, k]=Dt0$_{bl}$[j, k]+($\alpha$-1)*Dt0$_{bl}$[0, 0];

and generating the scaled delay values (Delay$_{scaled}$ (Output Load, Input ramp) for each scaled output load index and scaled input ramp index pair using the following equation:

Delay$_{scaled}$(Output Load, Input ramp)=$(\phi/2)*(\gamma-1)*OR_{bl}[0, 1]+(\alpha-1)*Dt0_{bl}[0, 0]+((1/\rho-1)/2)*$Input Ramp+Delay$_{bl}$(Output Load/$\lambda$, Input Ramp/$\rho$).

18. A method as in claim 17 wherein baseline output ramp value at zero load and minimum input ramp (OR$_{bl}$ [0,1]) is approximated using the following equation:

OR$_{bl}$[0, 1]=OR$_{bl}$[1, 1]-(Load$_1$/(Load$_m$-Load$_1$))*{OR$_{bl}$[m, 1]-OR$_{bl}$[1, 1]}, and wherein baseline new value at zero load and zero input ramp (Dt0$_{bl}$ [0, 0]) is approximated using the following equation:

Dt0$_{bl}$[0, 0]=Dt0$_{bl}$[1, 1]-(Load$_1$/(Load$_m$-Load$_1$))*{Dt0$_{bl}$[m, 1]-Dt0$_{bl}$[1, 1]}-(IR$_1$/(IR$_n$-IR$_1$))*{Dt0$_{bl}$[m, n]-Dt0$_{bl}$[m, 1]}.

19. A method as in claim 14 wherein substep (a.6) includes using a third scaling factor ($\alpha$) to generate the scaled delay values (Delay$_{scaled}$ [j,k]).

20. A method as in claim 19 wherein a value of the first scaling factor varies dependent upon process, power and temperature variances, wherein a value of the second scaling factor also varies dependent upon process, power and temperature variance, and wherein a value of the third scaling factor also varies dependent upon process, power and temperature variance.

21. A method as in claim 20 wherein the value of the first scaling factor additionally varies based on whether voltage at an output node of the logic cell is rising or falling, wherein the value of the second scaling factor also varies based on whether voltage at the output node of the logic cell is rising or falling, and wherein the value of the third scaling factor does not vary based on whether voltage at the output node of the logic cell is rising or falling.

* * * * *